United States Patent [19]
Taki

[11] Patent Number: 6,107,148
[45] Date of Patent: Aug. 22, 2000

[54] METHOD FOR FABRICATING A SEMICONDUCTOR DEVICE

[75] Inventor: Masushi Taki, Tateyama, Japan

[73] Assignee: Nippon Steel Semiconductor Corporation, Tokyo, Japan

[21] Appl. No.: 09/178,510

[22] Filed: Oct. 26, 1998

[51] Int. Cl.$^7$ .................................................. H01L 21/336
[52] U.S. Cl. ........................ 438/303; 438/301; 438/307; 438/673; 438/531
[58] Field of Search .................... 438/303, 305, 438/306, 307, 299, 595, 301, 585, FOR 188, 673, 531; 148/DIG. 161

[56] References Cited

U.S. PATENT DOCUMENTS

| | | | |
|---|---|---|---|
| 4,509,991 | 4/1985 | Taur | 29/571 |
| 5,877,530 | 3/1999 | Aronowitz et al. | 257/344 |
| 5,937,299 | 8/1999 | Michael et al. | 438/299 |

FOREIGN PATENT DOCUMENTS

| | | |
|---|---|---|
| 5-267325 | 10/1993 | Japan . |
| 06132299 | of 1994 | Japan . |
| 07115195 | of 1995 | Japan . |
| 08204184 | of 1996 | Japan . |

OTHER PUBLICATIONS

Naoe Ishizaka, Manufacture of Field Effect Transistor, 2–45935 (A), Fujitsu Ltd., 1990, Appl. No. 63–196791.
Takashi Omori, Manufacture of Semiconductor Device, 2–73638 (A), Kawasaki Steel Corporation, 1990, App. No. 63–224798.
Nobuyoshi Sakakibara, Manufacture of MOS Semiconductor Element, 3–69166 (A), Nippon Soken Inc., 1991, App. No. 64–205096.

*Primary Examiner*—Michael Trinh
*Attorney, Agent, or Firm*—Pollock, Vande Sande & Amernick

[57] ABSTRACT

A method for fabricating a semiconductor device having LDD structure. The method includes: a first step for forming an electrically insulating layer on an active area defined on a surface of a semiconductor substrate; a second step for forming a conductive layer on said insulating layer; a third step for forming a patterned photoresist layer of a downward tapered shape on said conductive layer; a fourth step for forming a gate electrode by patterning said conductive layer using a mask provided by bottom portions of said patterned photoresist layer; a fifth step for forming heavilyly doped regions at both sides of said gate electrode by introducing ions using a mask provided by top portions of said patterned photoresist layer; a sixth step for removing said patterned photoresist layer; and a seventh step for forming lightly doped regions at both sides of said gate electrode by introducing ions using a mask provided by said gate electrode.

8 Claims, 5 Drawing Sheets

METHOD FOR FABRICATING A SEMICONDUCTOR DEVICE

FIELD OF THE INVENTION

The present invention relates in general to a method for fabricating a semiconductor device, and in particular to a method to form doped regions in processes for fabricating a MOS transistor having a LDD structure.

BACKGROUND OF THE INVENTION

In the technical field of the MOS transistors, so called LDD (Lightly Doped Drain) structure is well known as a useful way to weaken concentration of the electric field between the drain areas and the gate areas. In the LDD structure, between the gate areas and the drain areas of heavily doped regions near the surface of the substrate, a lightly doped region of the same conductive type as the heavily doped region formed which causes a reduction of the strength of the electric field there. This LDD structure will be described referring to a figure.

Referring to FIG. 4(a), an active region is defined on the silicon semiconductor substrate 21 by forming field oxide layers 22 by way of an isolation process so called LOCOS. In the active region, a silicon oxide layer and a polysilicon layer are formed on the surface of the substrate successively, and a photoresist layer 28 is formed on the polysilicon layer and patterned by a conventional technique of the photo-lithography. Then an unisotropic dry etching is performed on the whole surface using the photo-resist layer 28 as an etching mask to form a gate oxide layer 23 of the silicon oxide and a gate electrode 24 of the polysilicon.

After the patterned resist layer 28 is removed from the surface of the gate electrode 24, an ion injection of phosphorus is performed by using the gate electrode 24 as a mask to form shallow surface region in which phosphorus is slightly doped.

A silicon oxide layer of a thickness of about 2000 Å is formed on the whole surface including active regions using a conventional technique of the chemical vapor deposition (CVD). Side walls 25 of the silicon oxide are formed at the side portions of the gate electrode 24 in a manner of self-alignment as shown in FIG. 4(c), by performing unisotropic etching. A width of the side walls 25 will be made to be less than 0.2 micron for LDD structures under the submicron design rule.

An ion injection of arsenic (As) is performed to form the heavily doped region under the surface of the active region by using the gate electrode 24 and side walls 25 as shielding masks. In this case, arsenic is injected in the areas which are apart from the gate electrode 24 by the width of the side walls 25. An annealing process is performed to activate the lightly doped regions 26 and the heavily doped regions 27 to accomplish the whole process to fabricate a MOS transistor having the LDD structure.

In the process for fabricating the MOS transistor having the LDD structure described above, ion injection processes are performed twice for forming the lightly doped regions 26 and the heavily doped regions 27 respectively. And between the two ion injection processes, the process for forming the side walls 25 must be performed including a formation of the silicon oxide layer to be changed into the side walls though the unisotropic etching.

As a result, the number of processes required becomes large to cause increase of the fabrication cost and decrease of the yield and the reliability.

SUMMARY OF THE INVENTION

It is therefore an object of the present invention to provide a method for fabricating a semiconductor device having the LDD structure with a reduced number of the fabrication steps to reduce the cost and time for the fabrication.

It is another object of the present invention to provide a method for fabricating such a semiconductor device which can increase the yield and the reliability of the products.

These and other objects, features and advantages of the present invention are provided by a method for fabricating a semiconductor devise comprising: a first step for forming an electrically insulating layer on an active area defined on a surface of a semiconductor substrate; a second step for forming a conductive layer on said insulating layer; a third step for forming a patterned photoresist layer of a downward tapered shape on said conductive layer; a fourth step for forming a gate electrode by patterning said conductive layer using a mask provided by bottom portions of said patterned photoresist layer; a fifth step for forming heavily doped region at both sides of said gate electrode by introducing ions using a mask provided by top portions of said patterned photoresist layer; a sixth step for removing said patterned photoresist layer; and a seventh step for forming lightly doped regions at both sides of said gate electrode by introducing ions using a mask provided by said gate electrode.

DESCRIPTION OF PREFERRED EMBODIMENT

Figure 2A:
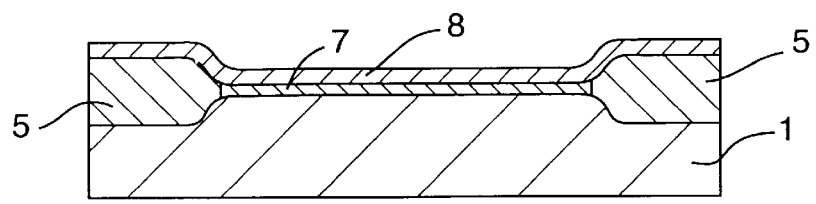
Figure 2B:
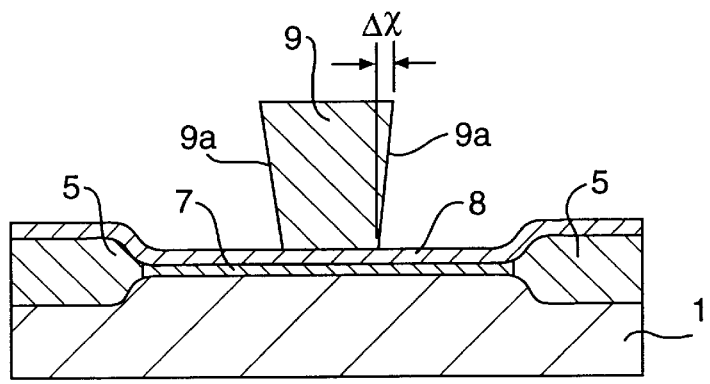
Figure 2C:
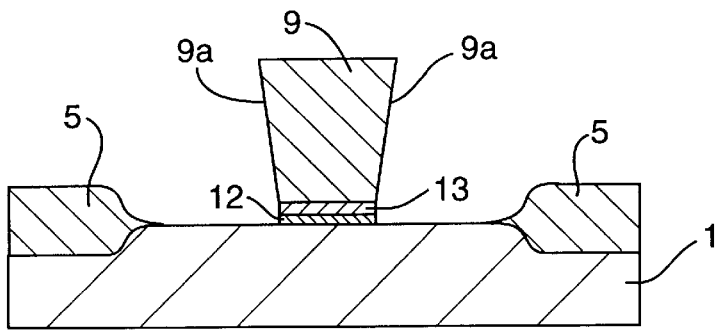
Figure 2D:
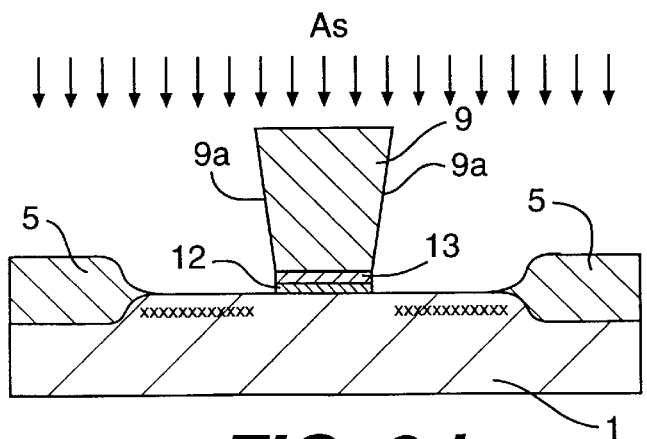
Figure 3A:
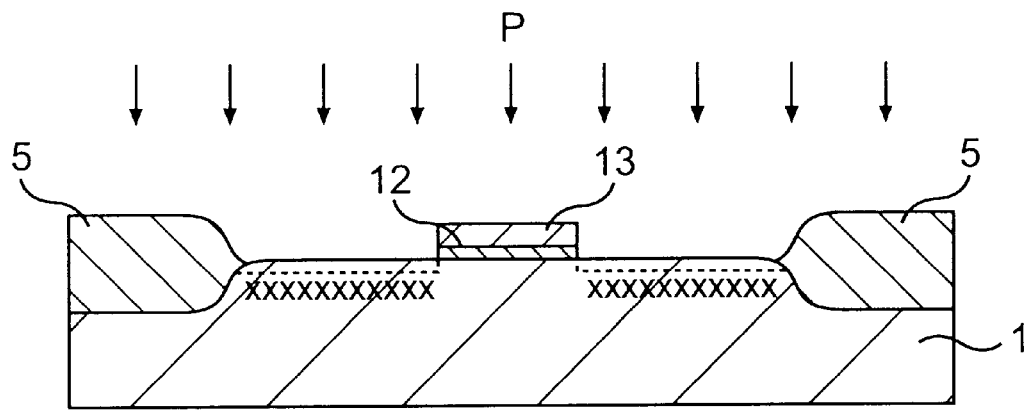
Figure 3B:
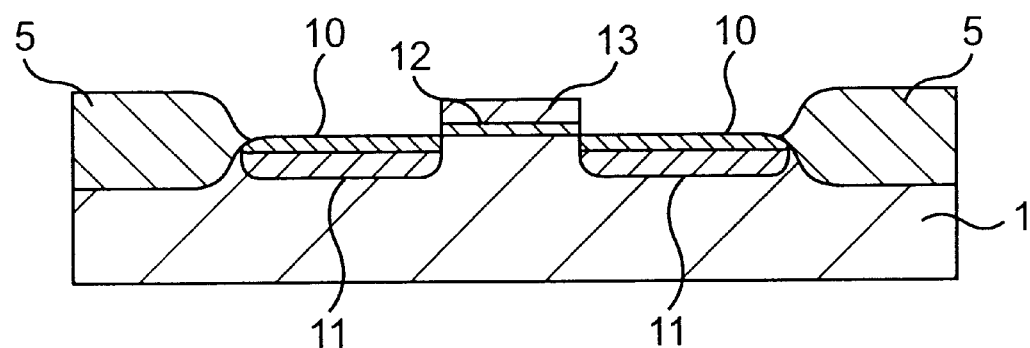
Figure 4A:
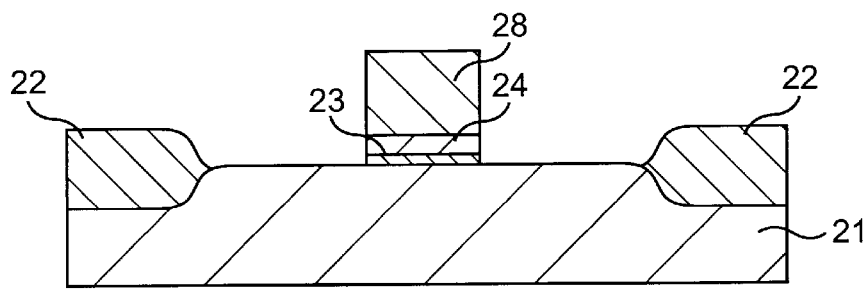
FIG. 4 illustrates a sectional view of an n-MOS transistor under the fabrication according to a prior art.
Figure 4B:
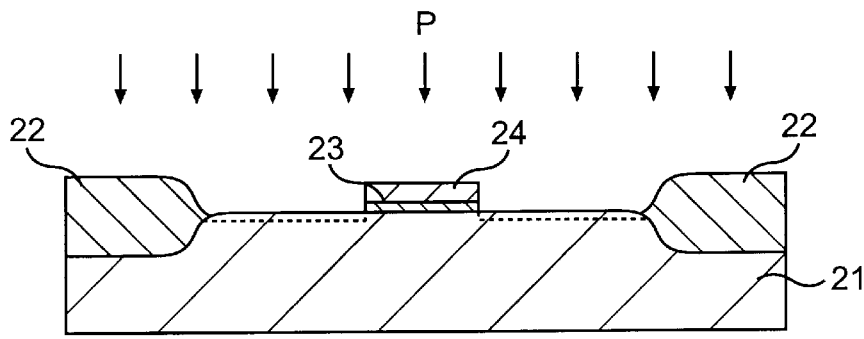
Figure 4C:
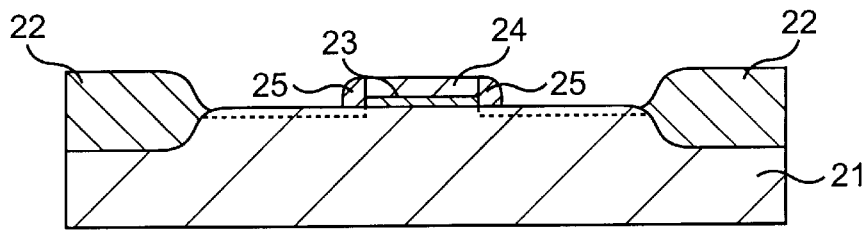
Figure 4D:
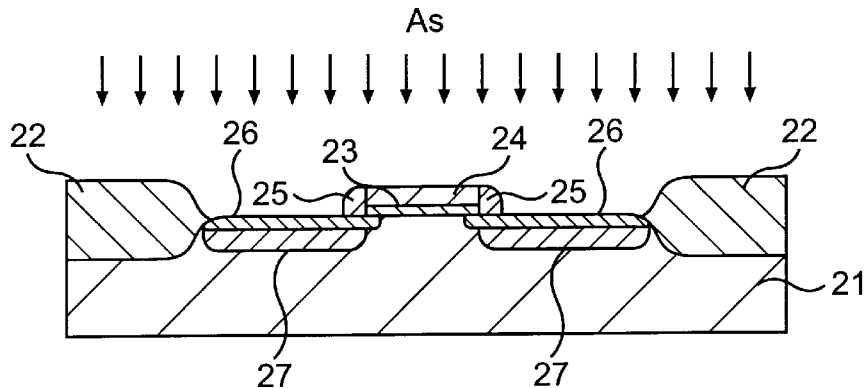

The present invention will now be described more fully hereinafter with reference to FIGS. 1–3 showing the sectional views of an n-MOS transistor under the fabrication.

Figure 1A:
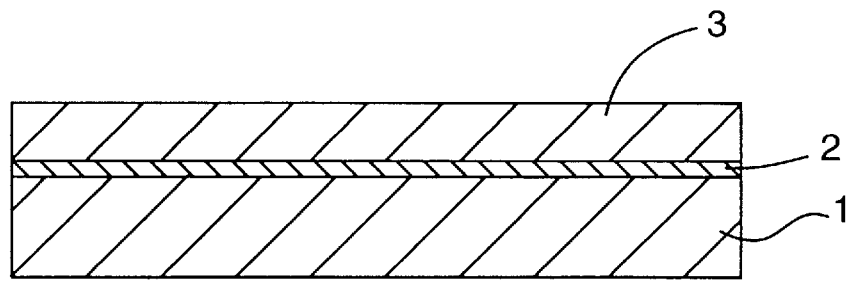
FIGS. 1–3 illustrate the sectional views of an n-MOS transistor under the fabrication according to an embodiment of the present invention.

First, as shown in FIG. 1(a), a thermally oxidized layer 2 of a thickness of about100 Å–300 Å is formed on a p-type silicon semiconductor substrate 1 by applying an appropriate process such as dry oxidization or a so called pyrogenic process in which hydrogen are burned to produce water for the oxidization. A silicon nitride layer 3 of a thickness of 1000 Å–1500 Å is formed on the silicon oxide layer 2. The silicon nitride layer 3 will work as a mask for the selective oxidization to form a field oxidization layer. The underlying thermally oxidized layer 2 works as a pad layer for the silicon nitride layer 3 to decrease the stress between the silicon substrate and the silicon nitride layer 3.

Figure 1B:
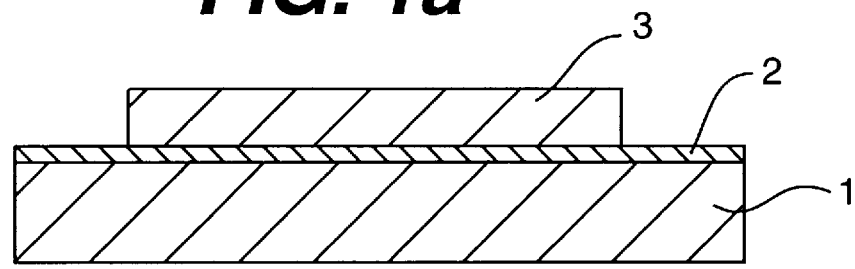

As shown in FIG. 1(b), a patterned silicon nitride layer 3 is formed by applying a conventional process in which a photoresist layer is patterned to have apertures only over the isolation regions, then dry etching is performed using the patterned photoresist layer as an etching mask As a result, the thermally oxidized layer 2 is exposed only in the isolation region. In the dry etching process, an etching gas of the composition of CF4/O2/N2 is generally used.

The patterned resist layer used to form the patterned silicon nitride layer 3 is removed by applying an appropriate process such as an oxygen-ashing process or a wet etching process using an appropriate etchant such as H2SO4/H2O2.

Figure 1C:
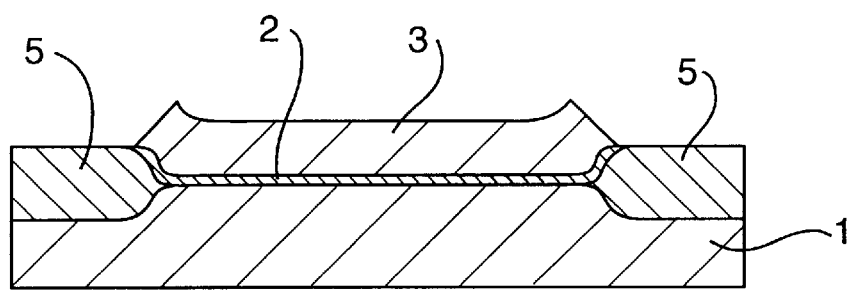
Figure 1D:
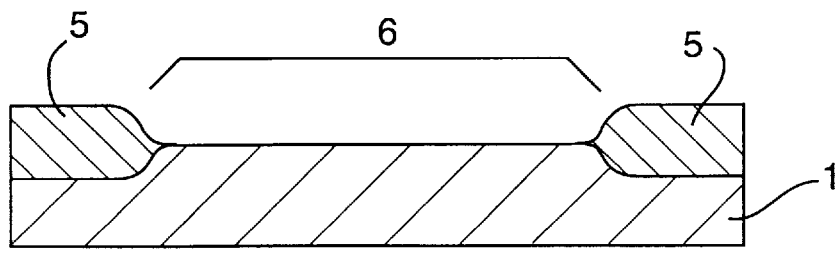

As shown in FIG. 1(c), the field oxide layers 5 of a thickness of 5000 Å–7000 Å are formed by way of pyrogenic process performed under the temperature of 950° C.–1000° C.

The silicon nitride layer 3 is removed by applying an appropriate process such as wet etching using phosphoric acid kept at the temperature of 70° C. The underlying oxide layer 2 is also removed by applying an appropriate process such as wet etching using buffered hydrofluoric acid to form a structure shown in FIG. 1(d). In the structure, an active region 6 is defined to be surrounded by the field oxide layers 5 in which the surface of the silicon substrate 1 is exposed.

As shown in FIG. 2(a), an oxide layer 7 is formed to provide a gate oxide layer in the active region 6 on the surface of the p-type silicon substrate 1. In this embodiment, the oxide layer 7 of a thickness of about 150 Å is formed by applying a dry an oxidization process in an atmosphere of N2/O2 and under the temperature of 950 C. Other appropriate processes such as oxidization process using hydrochloric acid or pyrogenic process can be applied as well.

A polysilicon layer 8 is formed on the oxide layer 7 to provide an electrical conductive layer to be operated as a gate electrode. The polysilicon layer 8 will be formed to have a thickness of 2000 Å using a various conventional method such as a low pressure CVD process. In the CVD process, a non-doped polysilicon layer is formed by SiH4 gas to be doped with phosphorus or a doped polysilicon layer is formed by adding PH3 gas to SiH4 gas in order to increase the conductivity of the layer to provide the gate electrode.

As shown in FIG. 2(b), a patterned photoresist layer 9 is formed on the polysilicon layer 8. The patterned photoresist layer 9 has a downward tapered shape in which the width of the layer in the cross sectional view gradually decreases downward (from the surface to the bottom). The downward tapered shape can be formed using a technique to make a reversed image. When this technique is applied to a positive type photoresist, an exposed portion remains to be a patterned photoresist layer instead of an unexposed portion which remains in ordinary case. The downward tapered shape causes a projection or an overhung of the side wall of the patterned photoresist of a width Δ X.

As the methods for forming such an overhanging side wall of the photoresist, two examples will be described below.

One is a method in which a photoresist of an amine diffusion type is used and comprises the three following steps. In the first step, a photoresist layer of an amine diffusion type is formed on the polysilicon layer and then be exposed to high UV radiation through a reticle having a pattern designed to form a gate electrode. In the second step, the amine are diffused inside the photoresist and carbonic acid is removed through a baking process to the photoresist for one hour to two hours. In the third step, a post exposure (flood exposure) is performed followed by development using an alkaline developing solution. As a result, a patterned photoresist 9 of a downward tapered shape having the overhanging side walls 9a can be obtained.

The other is a method in which a cross link is used and comprises the three following steps. In the first step, a layer of an appropriate photoresist of about 1.2 microns, for example AZ5200E which is a product of Tokyo-Oukakogyo, is formed on the polysilicon layer 8 using a spin coater and then be exposed to low level UV radiation. In the second step, a cross link is performed through a baking process in which the device coated with the photoresist layer is kept in a furnace of the temperature of 120° C. for 1–5 minutes. In the third step, a post exposure (flood exposure) is also performed followed by development using an alkaline developing solution. As a result, a patterned photoresist 9 of the downward tapered shape having the overhanging side walls 9a can be obtained.

In an example of the shape of the patterned photoresist layer 9, the upper parts of the side walls of the layer 9 of a thickness of 1.2 microns protrude by 0.2 microns than the bottom parts of the walls. In this case, the angle of the taper of the walls 9a are set to be more than 80 degrees. In another case in which the thickness of the photoresist layer 9 is set to be 2.0 microns, 86 degrees of the taper angle will be set to obtain the same amount of the protrusions of 0.2 microns.

The formation of the protrusions of the photoresist layer 9 makes it possible to eliminate the troublesome processes in the prior art to form the side walls of silicon oxide of the same width, 0.2 microns. This will become clear later when the ion injection process is described In which the photoresist layer 9 is used as a mask.

The above described angle of the taper of the side walls 9a is an important factor to determine the amount of the protrusion of the upper parts of the side walls 9a. The angle of the taper can be controlled by a condition of the baking process performed in the second fabrication step and a condition of the post exposure process performed in the third fabrication step in both examples described above.

Figure 5A:
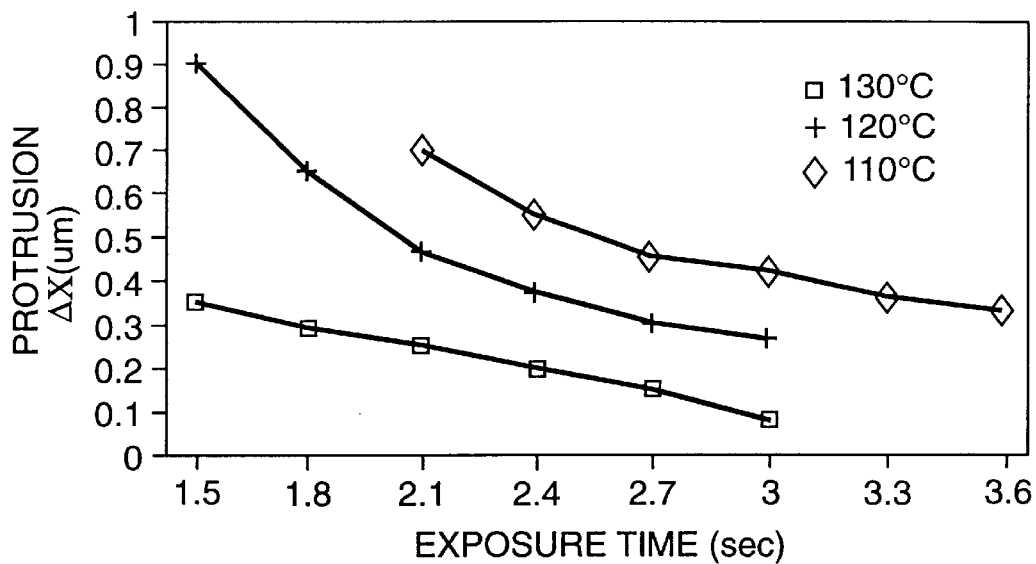
FIG. 5 illustrates the graphs showing relations between the sizes of the downward tapers and the fabrication parameters (exposure time) baking temperature.

FIG. 5(a) is a graph which shows a relation between the conditions of the processes in the second example and the amount of the protrusionΔ X of the side walls (in FIG. 2(b)). The conditions of the processes are the exposure time to UV radiation in the first step and the temperature of the baking in the second step. It is shown from the experiments that the protrusion of 0.2 microns of the side walls, for example, will be obtained by exposing a sample to UV radiation for 2.4 seconds and then bake it in a furnace of 130° C.

Figure 5B:
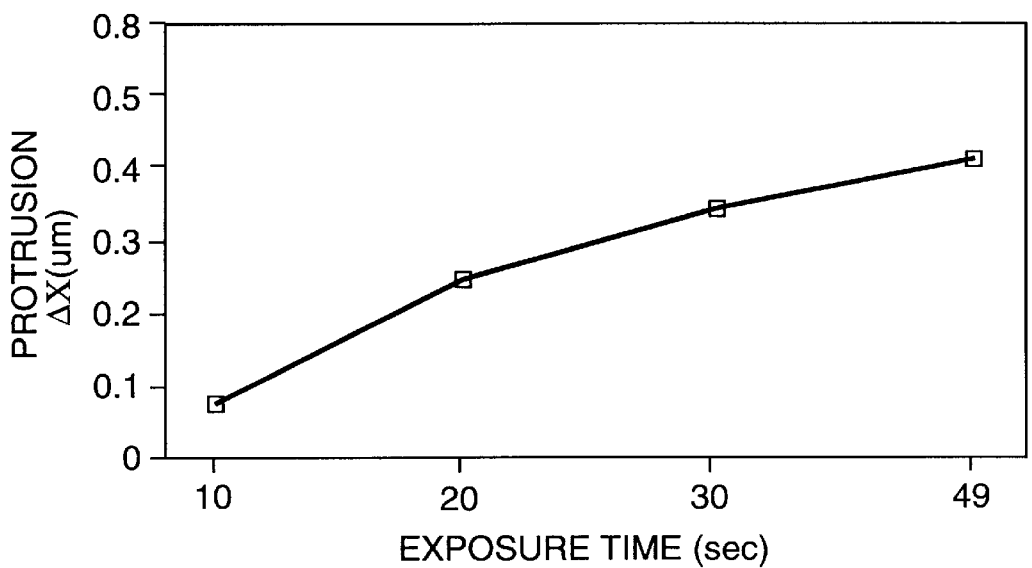

FIG. 5(b) is a graph which shows a relation between the condition of the post exposure in the third process and the amount of protrusion in the second example. It is shown from the experiments that protrusion of 0.2 micron of side walls, for example, will be obtained by exposing a sample to UV radiation for about 17 seconds.

After the formation of the patterned photoresist layer 9 unisotropic etching is performed using the photoresist layer 9 as etching mask. As shown in FIG. 2(c), a gate electrode 13 is formed from the polysilicon layer 8 and a gate oxide layer 12 is formed from the underlying silicon oxide layer 7. The gate electrode 13 is patterned to have almost the same width as that of the bottom part of the patterned photoresist 9.

As shown in FIG. 2(d), an ion injection is performed using an injection mask which is defined by a shape of the top surface of the patterned photoresist 9 to form highly doped p-type regions in the surface of the silicon substrate 1. As an example of a condition of the ion injection in the case of forming an n-MOS transistor according to the present embodiment, a dose of arsenic (As) of about $1.5 \times 10^{16}/cm^2$ will be injected under the acceleration energy of about 150 Kev.

As described above, the heavily doped region can be formed apart from the gate electrode 13, because the ion injection is performed using the patterned photoresist 9 having the downward tapered shape as a mask.

Then, as shown in FIG. 3(a), the patterned photoresist layer 9 is removed, and an ion injection process is performed by using the gate electrode 13 as a mask to form a lightly doped p-type regions in the surface of the silicon substrate 1. As an example of a condition of the ion injection in the case of forming an n-MOS transistor according to the present embodiment, a dose of phosphorus (P) of about $2.0\times10^{13}/cm^2$ will be injected under the acceleration energy of about 60 Kev.

As described above, the lightly doped regions can be formed close to the gate electrode 13, because the ion injection is made using the gate electrode 13 as a mask.

An annealing process is made to activate the ion-injected impurities in an atmosphere of N2/O2, under the temperature of 900 C for about thirty minutes As a result, the lightly phosphorus (P) doped regions 10 and the heavily arsenic (As) doped regions 11 are formed. Then a formation of insulation layers, contact holes and wiring layers are performed successively to accomplish the fabrication process of the n-MOS transistors according to the embodiment.

According to the embodiment described above, the patterned photoresist layer 9 having a downward tapered shape of a controlled size can be formed by utilizing the technique of an image inversion. The size of the shape is easily controlled by controlling the process parameters as shown in FIGS. 5(a) and 5(b).

As a result, the top end portions of the patterned photoresist 9 can be made to protrude over its bottom end portions, which makes it possible to make the doped regions 10 locate closer to the gate electrode 13 than the doped regions 11 does, by performing the two ion injection processes with and without a mask of the patterned photoresist 9.

Accordingly, it becomes possible to form a LDD structure without forming any side walls of silicon oxide, by utilizing the patterned photoresist 9 which is originally prepared for patterning a gate electrode 13. Thus the manufacturing process of a LDD structure for the n-MOS transistor can be simplified which reduces greatly manufacturing cost and increases greatly yield and reliability.

While the present invention has been described by showing only a few specific embodiments, it will be obvious to those skilled in the art that those embodiments should not be taken as limiting the spirit and the scope of the present invention which is defined by the appended claims.

What is claimed is:

1. A method for fabricating a semiconductor device comprising:

a first step for forming an electrically insulating layer on an active area defined on a surface of a semiconductor substrate;

a second step for forming a conductive layer on said insulating layer;

a third step for forming a patterned photoresist layer of a downward tapered shape on said conductive layer;

a fourth step for forming a gate electrode by patterning said conductive layer using a mask provided by bottom portions of said patterned photoresist layer;

a fifth step for forming heavily doped regions at both sides of said gate electrode by introducing ions using a mask provided by top portions of said patterned photoresist layer;

a sixth step for removing said patterned photoresist layer; and a seventh step for forming lightly doped regions at both sides of said gate electrode by introducing ions using a mask provided by said gate electrode.

2. The method of claim 1 wherein said patterned photoresist is formed by using a technique of image inversion.

3. The method of claim 1 wherein a cross link is performed during said third step for forming said patterned photoresist.

4. The method of claim 1 wherein said patterned photoresist comprises amine.

5. The method of claim 2 wherein said patterned photoresist comprises amine.

6. The method of claim 1 wherein said electrically insulating layer is patterned together with said underlying conductive layer in said fourth step.

7. The method of claim 2 wherein said electrically insulating layer is patterned together with said underlying conductive layer in said fourth step.

8. The method of claim 3 wherein said electrically insulating layer is patterned together with said underlying conductive layer in said fourth step.

* * * * *